US006550484B1

(12) United States Patent
Gopinath et al.

(10) Patent No.: US 6,550,484 B1
(45) Date of Patent: Apr. 22, 2003

(54) APPARATUS FOR MAINTAINING WAFER BACK SIDE AND EDGE EXCLUSION DURING SUPERCRITICAL FLUID PROCESSING

(75) Inventors: Sanjay Gopinath, Fremont, CA (US); Patrick A. Van Cleemput, Sunnyvale, CA (US); Francisco Juarez, Fremont, CA (US); Krishnan Shrinivasan, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/011,499

(22) Filed: Dec. 7, 2001

(51) Int. Cl.⁷ .................. B08B 6/00; C25F 1/00
(52) U.S. Cl. .................. 134/1.2; 134/2; 134/19; 134/34; 134/35; 134/182; 438/758; 438/759; 438/760; 438/782; 438/784
(58) Field of Search .................. 134/2, 19, 34, 134/35, 37, 182, 902; 438/758–760, 782, 784

(56) References Cited

U.S. PATENT DOCUMENTS 5,925,411 A * 7/1999 Van de Ven et al. .... 427/248.1

6,461,155 B1 * 10/2002 Settles .................. 432/247

OTHER PUBLICATIONS

Biberger et al., "High Pressure Processing Chamber for Semiconductor Substrate", Pub. No. US 2002/0046707 A1, Pub. Date: Apr. 25, 2002, Appl. No.: 09/912,844, Filed: Jul. 24, 2001pp. 1–19.

* cited by examiner

Primary Examiner—Wael Fahmy
Assistant Examiner—Wai-Sing Louie
(74) Attorney, Agent, or Firm—Beyer Weaver & Thomas, LLP

(57) ABSTRACT

The present invention pertains to apparatus and methods for maintaining wafer back side, bevel, and front side edge exclusion during supercritical fluid processing. Apparatus of the invention include a pedestal and an exclusion ring. When the exclusion ring is engaged with the pedestal a channel is formed. A reactant-free supercritical fluid is passed through the channel and over a circumferential front edge of a wafer. The flow of reactant-free supercritical fluid protects the bevel and circumferential front edge of the wafer from exposure to reactants in a supercritical processing medium. The back side of the wafer is protected by contact with the pedestal and the flow of reactant-free supercritical fluid. Exclusion rings of the invention, when engaged with their corresponding pedestals make no or very little physical contact with the wafer front side.

39 Claims, 9 Drawing Sheets

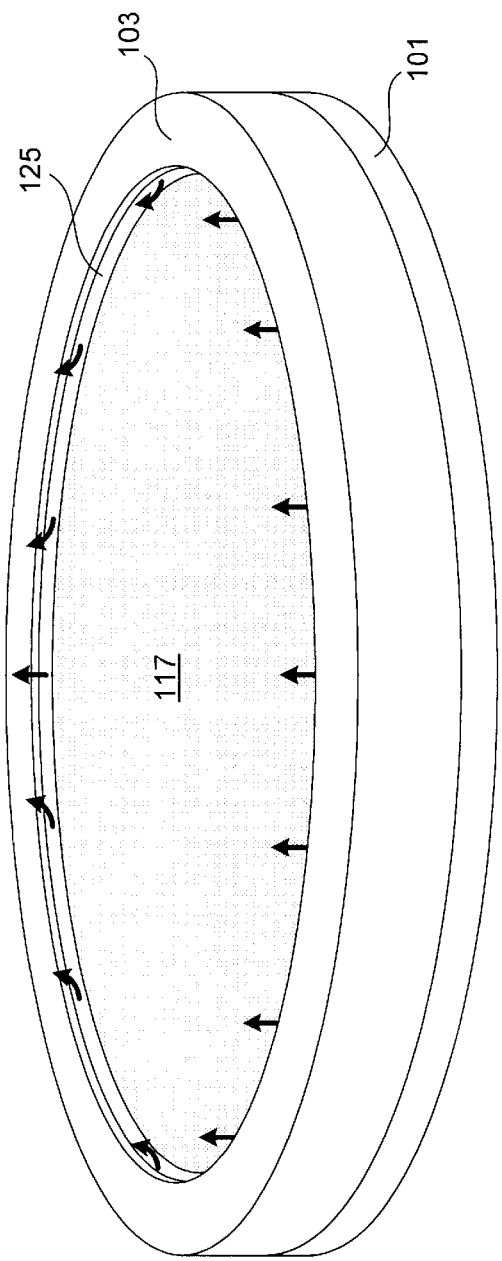
*Figure 1G*
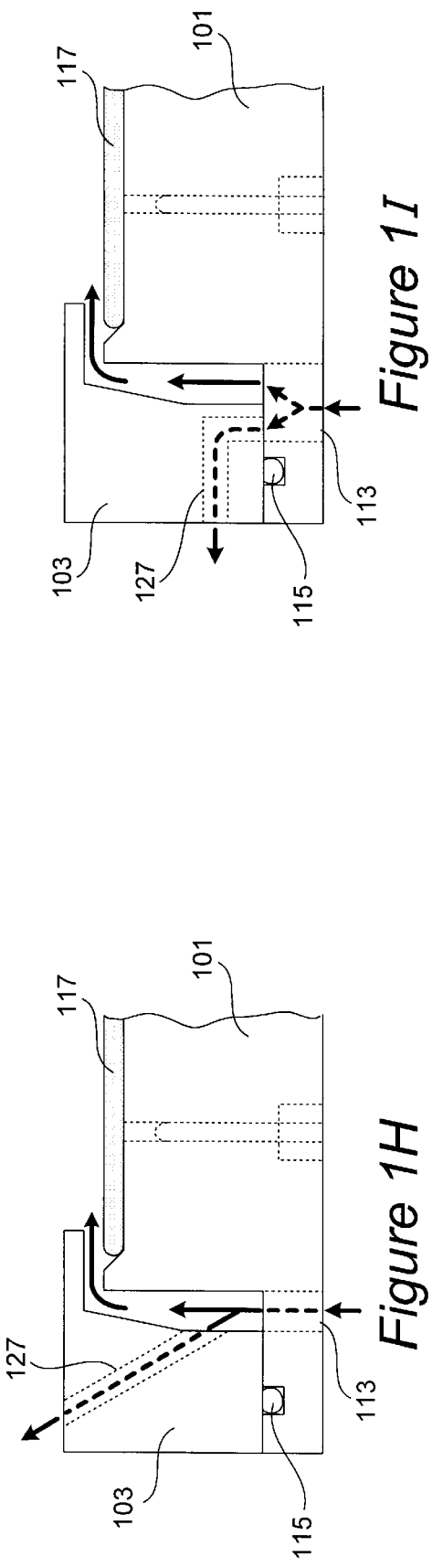
*Figure 1I*
*Figure 1H*

APPARATUS FOR MAINTAINING WAFER BACK SIDE AND EDGE EXCLUSION DURING SUPERCRITICAL FLUID PROCESSING

FIELD OF THE INVENTION

This invention relates to methods and apparatus for supercritical fluid processing of substrates. More particularly, it relates to methods and apparatus for maintaining wafer back side, bevel, and front side edge exclusion during supercritical fluid processing.

BACKGROUND OF THE INVENTION

Wafer handling in modern VSLI semiconductor processing presents numerous engineering dilemmas. One particularly important issue involves processing the wafer's work surface while protecting its back side and edge bevel from contamination with the processing medium. Typical processing operations include: deposition, etch, or other modification of the wafer work surface. Metal contamination on a wafer back side and edge bevel is especially problematic. Metal contaminates ultimately end up on the front side, due to handling, ultimately ruining devices on the front side due to diffusion of metal into unprotected dielectrics.

Key components in wafer handling during processing are wafer chuck and pedestal assemblies as well as end effectors. End effectors are used to deliver wafers to and from wafer pedestals. Preferably, end effectors grab wafers only on the back side to avoid contamination or alteration of the work surface. The wafer back side is typically in contact with the pedestal, held in place by a restraining device, for example a vacuum, electrostatic, or multi-point clamp. Clamps must hold the wafer in place while avoiding application of undue stress to the wafer. Additionally, it is often desired that the wafer make good thermal contact to the pedestal so that pedestal-mediated heating or cooling processes are efficient.

Cleary et al. (U.S. Pat. No. 6,281,144) and van de Ven et al. (U.S. Pat. No. 5,882,417) describe methods and apparatus for back side and edge exclusion during CVD processing. In these inventions, unique pedestal design with controlled gas flow patterns provide protection of the back side and edge bevel regions by blocking deposition of materials on these areas during processing. While these inventions are effective with respect to low pressure CVD processing conditions, they do not address the unique conditions encountered during wafer processing with supercritical fluids.

Under supercritical process conditions, there are very large pressure changes, density gradients, and temperature effects. For example, convection in supercritical fluids may transfer heat from a wafer too quickly. Drastic pressure changes can shatter wafers having even the slightest stress due to the restraining device. Additionally, movement of mechanical apparatus is restricted under supercritical pressure. Preferably, supercritical reactors have minimal moving parts. Thus supercritical process conditions present unique challenges for design of wafer handling apparatus and methods for using them.

What is therefore needed are improved apparatus and methods for handling wafers in supercritical fluid reactors. In particular, what is needed are apparatus and methods that provide wafer back side, bevel, and front side edge exclusion during supercritical fluid processing, preferably apparatus and methods that take advantage of supercritical fluid process conditions.

SUMMARY OF THE INVENTION

The present invention pertains to apparatus and methods for maintaining wafer back side, bevel, and front side edge exclusion during supercritical fluid processing. Apparatus of the invention include a pedestal and an exclusion ring. When the exclusion ring is engaged with the pedestal, a channel is formed. A reactant-free supercritical fluid is passed through the channel and over a circumferential front edge of a wafer. The flow of reactant-free supercritical fluid protects the bevel and a circumferential front edge of the wafer from exposure to reactants in a supercritical processing medium. The back side of the wafer is protected by contact with the pedestal and the flow of reactant-free supercritical fluid.

One aspect of the invention is an apparatus for immobilizing a wafer and preventing a reactant from contacting the back side, bevel, and a circumferential front edge of the wafer during a surface modification process on the front side of the wafer in a supercritical medium containing the reactant. Such apparatus may be characterized by the following features: (a) a pedestal having a wafer support surface, the wafer support surface configured to support the wafer via the wafer back side; and (b) an exclusion ring which when engaged with the pedestal, is configured to provide a flow of a reactant-free supercritical fluid and prevent the reactant in the supercritical medium from contacting the back side, bevel, and the circumferential front edge of the wafer during the surface modification process. Preferably the apparatus is part of a supercritical reactor assembly. Also preferably the circumferential front edge is between about 0.1 mm and 5 mm wide, more preferably between about 1 mm and 3 mm wide. Each of the reactant-free supercritical fluid and the supercritical medium preferably include at least one of carbon dioxide, ammonia, water, ethanol, ethane, propane, butane, pentane, dimethyl ether, hexafluoroethane, and mixtures thereof.

Preferably the pedestal has an internal heat source and the wafer support surface has a lip configured to center the wafer on the wafer support surface. Preferably the lip protrudes from the wafer support surface at least to the elevation of the front side of the wafer when the wafer is on the wafer support surface. Also preferably, the lip has a sloped surface configured to engage the wafer edge.

In preferred embodiments, the pedestal has a flange with a mating surface configured to mate with the exclusion ring when the pedestal and the exclusion ring are engaged. Preferably the mating surface has an elastomeric seal, configured to form a fluid-tight seal between the pedestal and the exclusion ring during engagement. Preferably the elastomeric seal comprises at least one of an O-ring, a cup seal, a flap seal, a T-seal, a C-seal, a self-energized seal, and the like. Also preferably the elastomeric seal comprises at least one of Viton, Kalrez, Chemraz, silicone, perfluorinated hydrocarbons, EPDM, PTFA, and the like.

Also, the exclusion ring and the pedestal form a channel when engaged. The channel is configured to provide the flow of the reactant-free supercritical fluid to the wafer. The reactant-free supercritical fluid exits the channel through a channel outlet between about 25 and 250 $\mu$m wide, more preferably about 50 $\mu$m wide. Preferably the flange has a plurality of apertures configured to supply the flow of the reactant-free supercritical fluid to the channel. Preferably the flow rate of reactant-free supercritical fluid exiting the channel outlet is between about 0.5 and 50 cc per minute, more preferably between about 5 and 20 cc per minute. In some embodiments the exclusion ring is configured to divert a portion of the flow of reactant-free supercritical fluid to a location other than the wafer surface. Preferably the portion diverted is between about 50 and 95% of the total flow of reactant-free supercritical fluid, more preferably between about 70 and 90%.

In some preferred embodiments, the exclusion ring has an overhang that comprises part of the channel. The overhang is configured to protrude over the wafer's front edge when the exclusion ring is engaged with the pedestal. Preferably the overhang protrudes between about 1 mm and 10 mm over the wafer's front edge, more preferably between about 1 mm and 5 mm.

Exclusion rings of the invention, when engaged with their corresponding pedestals make no or very little physical contact with the wafer front side. A non-contact exclusion ring is used when no contact with the wafer front side is desired. In some preferred embodiments a contact exclusion ring is used. Contact exclusion rings of the invention preferably have minimal contact with the wafer front side.

Mechanisms for delivering the wafer to the pedestal are embodied in three exemplary apparatus. In one apparatus, the pedestal comprises a plurality of active pins arranged to receive the wafer via the wafer back side and recess into the wafer support surface of the pedestal in order to deliver the wafer to the wafer support surface. Preferably such an apparatus is used with a non-contact exclusion ring. In a second apparatus, the exclusion ring is a non-contact exclusion ring comprising a plurality of wafer transfer fingers arranged to support the wafer via the wafer backside for delivery of the wafer to the wafer support surface. In a third apparatus, the pedestal is an inverted pedestal, and the exclusion ring is a contact exclusion ring having a plurality of point contacts arranged to support the wafer via the wafer front side for delivery of the wafer to the wafer support surface. In this third example, the contact exclusion ring, when engaged with the inverted pedestal, is also configured to hold the wafer onto the wafer support surface of the inverted pedestal via the plurality of point contacts. The plurality of point contacts are configured to exert a force opposing gravity on the front side of the wafer.

Another aspect of the invention is a method of conducting a surface modification process on the front side of a wafer in a supercritical medium containing a reactant without allowing the reactant to contact the back side and a circumferential front edge of the wafer. Such methods may be characterized by the following sequence: (a) providing the wafer to a reactor having a pedestal with a wafer support surface, the back side of the wafer contacting the wafer support surface; (b) charging the reactor with a reactant-free supercritical fluid; (c) providing a flow of the reactant-free supercritical fluid over at least the circumferential front edge of the wafer in a manner that prevents the reactant in the supercritical medium from contacting the circumferential front edge, bevel, and back side of the wafer; (d) providing the supercritical medium to the reactor; (e) performing the surface modification process; and (f) flushing the reactor with the reactant-free supercritical fluid.

Methods of providing the wafer to a reactor, as described in (a) above, depend upon the particular apparatus used. With respect to apparatus of the invention having non-contact exclusion rings and pedestals with active pins, (a) may be characterized by the following sequence: (i) raising a plurality of active pins from a recessed position in the pedestal so that they protrude from the wafer support surface; (ii) placing the wafer on the plurality of active pins, the back side of the wafer resting on the plurality of active pins; and (iii) returning the plurality of active pins to the recessed position in the pedestal, thereby resting the back side of the wafer on the wafer support surface. Preferably the non-contact exclusion ring is engaged with the pedestal immediately after (a). With respect to apparatus of the invention having non-contact exclusion rings with wafer transfer fingers and pedestals with recesses that mate with the transfer fingers, (a) may be characterized by the following sequence: (i) inserting the wafer into a non-contact exclusion ring having a plurality of wafer transfer fingers arranged to support the wafer via the wafer backside; and (ii) engaging the non-contact exclusion ring with the pedestal, during engagement, the plurality of wafer transfer fingers travel into a plurality of corresponding recesses in the pedestal and transfer the wafer to the wafer support surface of the pedestal. With respect to apparatus of the invention having contact exclusion rings and inverted pedestals, (a) may be characterized by the following sequence: (i) inserting the wafer into a contact exclusion ring having a plurality of point contacts arranged to support the wafer via the wafer front side; and (ii) engaging the contact exclusion ring with the inverted pedestal, the plurality of point contacts holding the wafer against the wafer support surface of the inverted pedestal via the wafer front side. Preferably, exclusion rings of the invention, when engaged with their corresponding pedestals, are configured to provide the flow of reactant-free supercritical fluid as described in (c) above.

These and other features and advantages of the present invention will be described in more detail below with reference to the associated drawings.

BRIEF DESCRIPTION OF THE DRAWINGS

FIG. 1G is a perspective of the pedestal and non-contact exclusion ring depicted in FIGS. 1A–F engaged, with a wafer on the pedestal.

FIGS. 1H–I are cross sectional depictions of apparatus with additional fluid channeling mechanisms.

DETAILED DESCRIPTION OF PREFERRED EMBODIMENTS

Figure 1A:
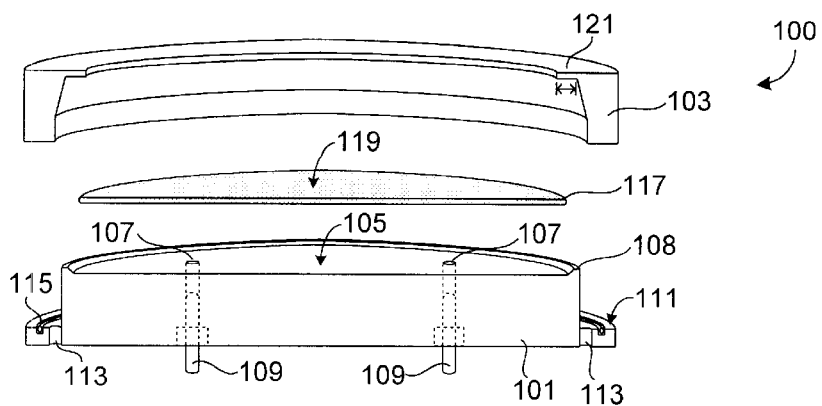
FIG. 1A is a cross sectional perspective depicting an apparatus of the invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described generally in terms of depositing a preccursor on a wafer, the invention can also be used for cleaning or otherwise treating wafers with supercritical media. In some descriptions herein, well-known processes, procedures, and components have not been described in detail so as not to unnecessarily obscure aspects of the present invention.

In this application, the term "wafer" is used extensively. The term "wafer" is meant to mean a semiconductor wafer during any of many stages of integrated circuit fabrication thereon. Preferably the invention is used as part of a Damascene process on a wafer using copper. For example, the invention can be used to deposit copper or dielectric materials under supercritical conditions. However as mentioned, the invention is not limited to such processing. The term "pedestal" is meant to describe a pedestal having an orientation such that a wafer back side rests on the pedestal and the wafer front side (work surface) faces up. An "inverted pedestal" has an orientation such that a wafer back side is held against the inverted-pedestal by a force opposing gravity and the wafer front side (work surface) faces down.

Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the reduced temperature and pressure of a solution are both greater than 80% of their critical point but the solution is not yet in the supercritical phase. Due to their high density, supercritical and near supercritical fluids possess superior solvating properties. In this application, when a fluid, solvent, or other medium is referred to as "supercritical" it is understood to describe both supercritical and near supercritical conditions.

As mentioned, apparatus of the invention provide an environment in which a pressure differential between two supercritical fluid mediums, one containing reactants and one free of reactants, exists. This environment protects certain areas of a wafer from substantial contact with reactants during processing. One skilled in the art would understand that there may be some finite amount of diffusion of one supercritical medium into another, i.e. some mixing may occur. The purpose of the invention is to prevent a supercritical processing medium containing a reactant or reactants from contacting a wafer back side, bevel, and a circumferential front edge, while the remainder of the wafer front side makes full contact with the supercritical processing medium. This is particularly useful for deposition processes, where back side contamination is problematic. To minimize mixing to a finite amount, a positive pressure of the reactant-free supercritical fluid is maintained over the circumferential front edge of the wafer during front side processing. In this way, the reactant-containing supercritical fluid is prevented from contacting this surface region of the wafer front side.

For integrated circuit fabrication, the usable plated surface area of a semiconductor wafer must be maximized so that the highest possible yield of circuit dies is achieved. This must be balanced with the desire to protect a circumferential front edge of the wafer, from for example deposition reactions, in order to maintain accessibility to conductive or other layers. Thus, in order to increase the usable area, but maintain accessibility, the area of the circumferential front edge is preferably minimized. The circumferential front edge of the wafer may be visualized as an annulus, defined by an outer circle, coincident with the outermost edge of the wafer on the work surface (front side, i.e. not including the bevel), and an inner circle, of a diameter less than the outer circle. Preferably the circumferential front edge is between about 0.1 mm and 5 mm wide, more preferably between about 1 mm and 3 mm wide.

Because apparatus of the invention are used in conjunction with supercritical media (typically a solvent plus a reagent), preferably such apparatus have minimal moving parts. By having minimal moving parts, the number of requisite sealing members is also minimized. At the same time, a unique supercritical fluid environment must be established and maintained throughout a wafer processing regimen. Apparatus for creating such an environment in a wafer processing setting include a pedestal and an exclusion ring, that when combined, form a channel through which a reactant-free supercritical fluid is passed. In one aspect, supercritical fluid flow is controlled by the dimensions of the channel, fluid inlets, fluid outlets, and the like. A positive flow of reactant-free supercritical fluid is maintained over areas of the wafer, thus preventing contact with the wafer processing fluid (i.e. that which contains reactants). In deposition reactions, uniformity of the deposited material is very important, especially in integrated circuit fabrication applications. Preferably deposition uniformity is not compromised in favor of perfect edge exclusion.

Figure 1B:
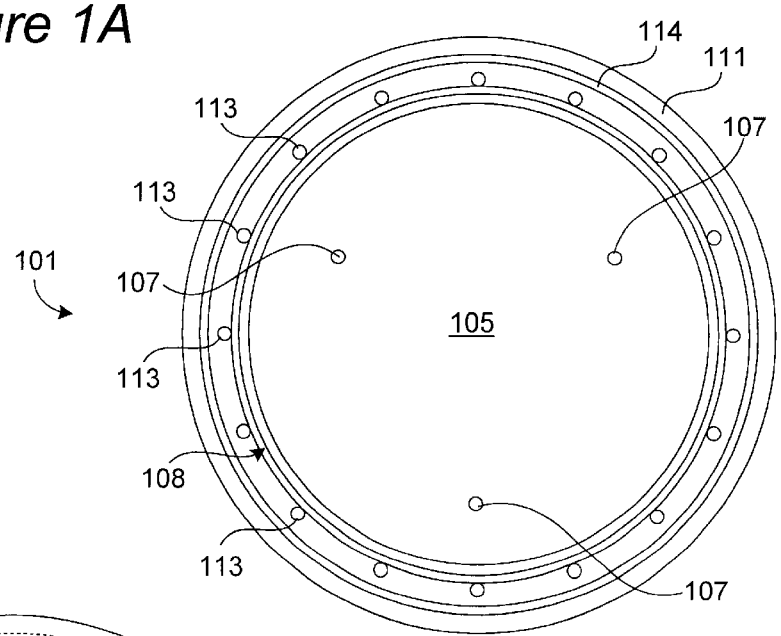
FIG. 1B depicts a top view of a pedestal of the invention.
Figure 1C:
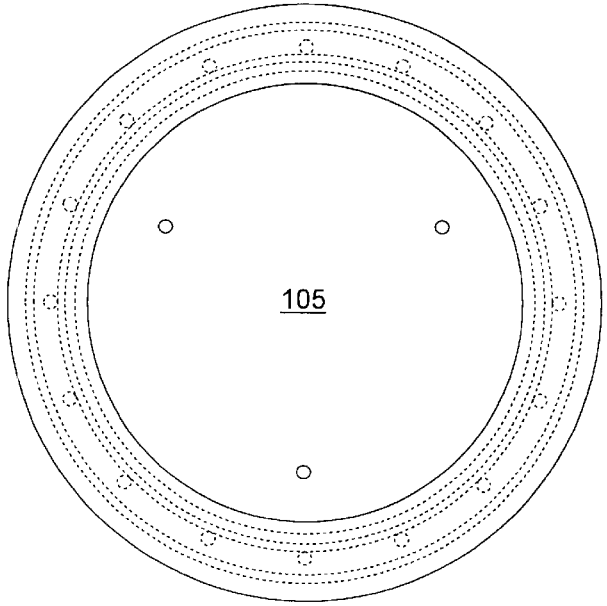
FIG. 1C depicts a top view of the pedestal in FIG. 1B engaged with the non-contact exclusion ring depicted in FIG. 1A.

FIGS. 1A–G are simplified depictions showing aspects of one apparatus of the invention. FIG. 1A is a cross sectional exploded perspective depicting an apparatus, 100, of the invention. Included are a wafer pedestal 101 and a non-contact exclusion ring 103. Pedestal 101 has a wafer support surface 105. Pedestals of the invention can support 100 mm, 200 mm, 300 mm, and other standard wafer sizes. Pedestals of the invention preferably have internal heaters (not shown) for heating a wafer via their wafer support surfaces. FIG. 1B shows a top view of pedestal 101; wafer support surface 105 is shown in its entirety. When a wafer is rested on pedestal 101, the back side of the wafer rests on wafer support surface 105. Wafer support surface 105 has recesses 107 (see also FIG. 1B) that act as sleeves for active pins 109, that is, active pins 109 slide inside recesses 107. Active pins 109 are shown in a recessed position, that is, they are recessed into pedestal 101 (FIG. B shows that in this case there are three recesses 107 and thus three active pins in apparatus 100). Active pins 109 can also be positioned so that they protrude from wafer support surface 105. Active pins 109 move in unison. For example when they protrude from the pedestal, they do so equally, and thus provide three points for wafer 119 to rest horizontally upon, above wafer support surface 105. The mechanism for moving active pins 109 is not shown. It is understood that such a mechanism is a peripheral component of apparatus 100. It is also understood that apparatus of the invention are used in conjunction with supercritical reactors. Also, preferably end effectors used with apparatus 100 will be dimensioned such that active pins 109 do not interfere with delivery of the wafer thereon by such end effectors.

In FIG. 1A, wafer 117 is shown suspended above pedestal 101 in order to depict its relative positioning with pedestal 101 and non-contact exclusion ring 103. Wafer 117 has a front side 119 and a back side (not shown). In order to process the front side 119 of wafer 117, the wafer is first rested upon protruding active pins 109 via its back side, active pins 109 are moved to the recessed position which rests wafer 117 upon wafer support surface 105, and then non-contact exclusion ring 103 is engaged with pedestal 101. Only after non-contact exclusion ring 103 is engaged with pedestal 101 is supercritical fluid introduced into the apparatus. Exclusion ring 103 is referred to as "non-contact" because it makes no physical contact with the wafer at any time. These arrangements and sequences will be discussed in more detail below with reference to FIGS. 1D–F.

Pedestal 101 also has a lip 108 that serves multiple functions. First, when wafer 117 is lowered onto wafer support surface 105, lip 108 acts as a centering mechanism for the wafer. In this example, lip 108 has a sloped surface that guides wafer 117 (via its outermost edge) to wafer support surface 105 (which makes coincident contact with the wafer back side) and centers it thereon. Second, lip 108 prevents flow of supercritical fluid under the wafer so that the wafer is not lifted during processing. This will be discussed in more detail below with reference to FIGS. 1D–F.

Referring again back to FIG. 1A, pedestal 101 has a flange 111 that has a plurality of apertures 113 about its inner edge (see also FIG. 1B). Apertures 113 are inlets for reactant-free supercritical fluid that will be flowed through apparatus 100. More specifically, when non-contact exclusion ring 103 is engaged with pedestal 101, a channel is formed between them. Apertures 113 provide a flow of reactant-free supercritical fluid that passes through the channel and over a circumferential front edge of wafer 117.

Flange 111 also has an elastomeric seal 115, contained in a trough 114 (see FIGS. 1A–B). When exclusion ring 103 is engaged with pedestal 101, they contact each other via the bottommost surface of exclusion ring 103 mating with top surface of flange 111. This compresses elastomeric seal 115 and forms a fluid-tight seal, capable of withstanding temperatures and pressures of the supercritical regime. One skilled in the art would understand that elastomeric seal 115 may take many forms. Preferably an elastomeric seal of the invention includes at least one of an O-ring, a cup seal, a flap seal, a T-seal, a C-seal, a self-energized seal, and the like. Also preferably the elastomeric seal comprises Preferably seals of the invention are made of elastomeric materials including at least one of Viton, Kalrez, Chemraz, silicone, perfluorinated hydrocarbons, EPDM, PTFA, and the like.

In order to achieve sufficient flow coverage of the reactant-free supercritical fluid over the circumferential front edge, non-contact exclusion ring 103 has an overhang 121. The double-headed arrows in FIG. 1A show a primary dimension of overhang 121, that is, how far the exclusion ring protrudes over the front edge of the wafer. This overhang is preferably uniform (as depicted) over the wafer surface, however the invention is not limited in this way. Preferably, exclusion rings of the invention have an overhang that protrudes over the front edge of the wafer between about 1 mm and 10 mm, more preferably between about 1 mm and 5 mm.

When non-contact exclusion ring 103 is engaged with pedestal 101 (which supports wafer 117), overhang 121 protrudes over an outer portion of wafer support surface 105 including lip 108. This can be seen more clearly in FIG. 1C, which depicts a top view of pedestal 101 engaged with non-contact exclusion 103. The dotted lines represent those portions of pedestal 101 that are beneath exclusion ring 103; the solid lines show the innermost and outermost edges of exclusion ring 103. Thus referring to FIG. 1C, reactant-free supercritical fluid enters pedestal 101 through apertures 113, passes through a channel formed by the engagement of pedestal 101 and exclusion ring 103. The latter portion of that channel is formed by the surfaces of lip 108 and overhang 121. Depending on the amount of overhang, the distance between the overhang and the wafer support surface (primarily lip 108), and the flow rate of the supercritical fluid through the channel, the area protected from reactant-containing supercritical fluid (the area of the circumferential front edge) varies. Preferably the flow rate of reactant-free supercritical fluid over the wafer is between about 0.5 cc per minute and 50 cc per minute, more preferably between about 5 cc per minute and 20 cc per minute.

Figure 1D:
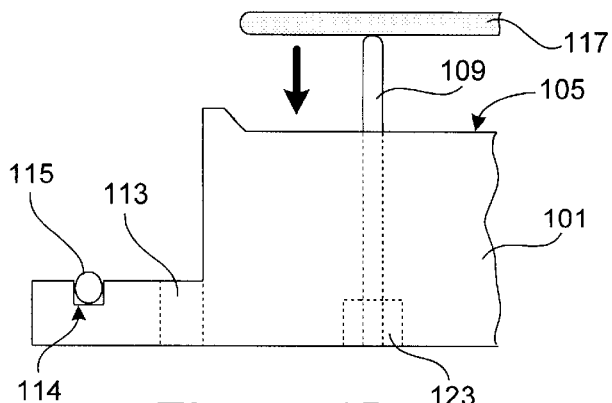
FIGS. 1D–F are cross sectional depictions of the pedestal and non-contact exclusion ring depicted in FIGS. 1A–C showing engagement orientations.
Figure 1E:
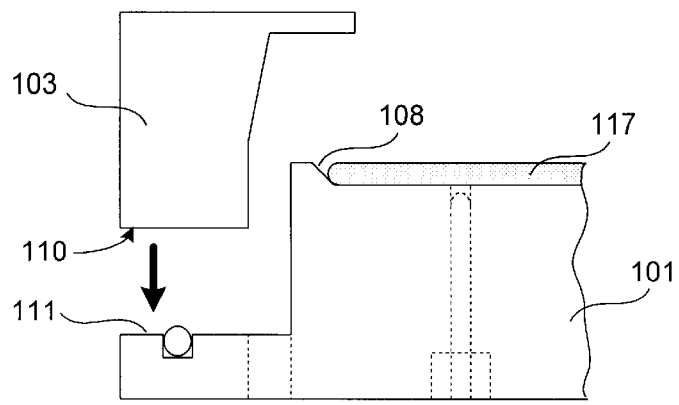
Figure 1F:
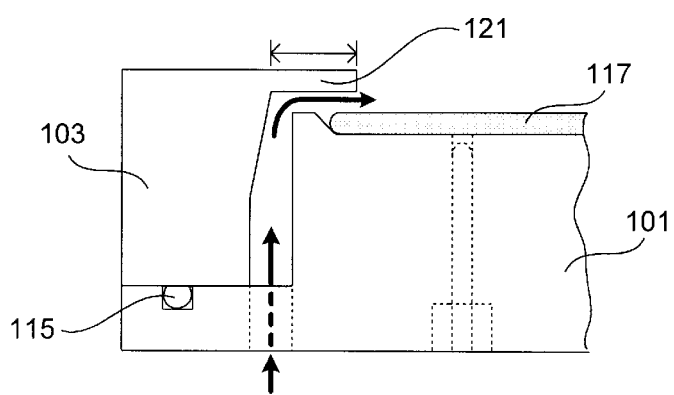

FIGS. 1D–F are cross sectional depictions of portions of pedestal 101 and non-contact exclusion ring 103 during various stages of engagement. Referring to FIG. 1D, as mentioned above, initially active pins 109 are positioned so that they protrude from pedestal 101 and wafer 117 is rested upon them via its back side. Each active pin 109 has a static seal 123, that is, pins 109 are never moved under supercritical conditions, so seals 123 need only perform a sealing function under those conditions. Under atmospheric conditions, when the wafer is being loading into apparatus of the invention, active pins 109 are moved up and down, and static seals 123 are not needed. Only after wafer 117 is supported by pedestal 101, i.e. the active pins are recessed into the pedestal, are supercritical conditions created. Under supercritical conditions, static seal 123 forms a fluid tight seal capable of withstanding temperatures and pressures of the supercritical regime. One skilled in the art would understand that static seal 123 may take many forms. Preferably a static seal of the invention includes at least one of an an O-ring, a cup seal, a flap seal, a T-seal, a C-seal, a self-energized seal, and the like. Preferably static seals of the invention are made of elastomeric materials including at least one of Viton, Kalrez, Chemraz, silicone, perfluorinated hydrocarbons, EPDM, PTFA, and the like. In this example each pin 109 has its own static seal. In a particular preferred embodiment, active pins 109 share a common static seal, for example a sealing membrane positioned either within or below pedestal 101. Preferably, the membrane is made of at least one of the elastomeric materials listed above.

FIG. 1D also shows the position of a hole 113 and elastomeric seal 115 within trough 114. The dark arrow depicts movement of active pin 109 into pedestal 101, which lowers wafer 117 onto wafer support surface 105. Referring to FIG. 1E, after active pin 109 is completely recessed into pedestal 101, wafer 117 rests on wafer support surface 105. An angled surface of lip 108 serves to contact the bevel edge of wafer 117 and guide the wafer to wafer support surface 105. Lip 108 is dimensioned so that once the wafer rests on wafer support surface 105, it is properly centered on pedestal 101. After wafer 117 is on pedestal 101, exclusion ring 103 is lowered onto pedestal 101 (movement depicted by the dark arrow). At this stage, exclusion ring 103 is not yet engaged with pedestal 101.

When engaged, bottom most surface 110 of exclusion ring 103 and top most surface of flange 111 will mate. FIG. 1F shows this engagement (note, exclusion ring 103 does not physically contact wafer 117). Elastomeric seal 115 is compressed to form a fluid-tight seal, and a channel is formed through which reactant-free supercritical fluid is passed (as indicated by the heavy arrows). Supercritical fluid flows through apertures 113, between the inner surface of exclusion ring 103 and the outer surface of pedestal 101, over lip 108 and under overhang 121. Lip 108 prevents the flow of fluid from traveling under the wafer and lifting it. Preferably, the top of lip 108 is at least as high as the front (work) surface of the wafer.

As mentioned, creating and controlling the flow of supercritical fluid through this channel and over a circumferential front edge of the wafer is dependent on: the size and number of apertures 113, the dimensions of the channel formed by engagement of the exclusion ring with the pedestal, the amount of overhang, and the flow rate of the fluid.

FIG. 1G is a perspective showing engagement of pedestal 101 and non-contact exclusion ring 103 depicted in FIGS. 1A–F with wafer 117 on the pedestal. In this depiction, the channel formed by the engagement of pedestal 101 with exclusion ring 103 has a channel outlet, 125. In this example, channel outlet 125 is ring-shaped and has a width defined as the distance from the top of lip 108 to the bottom surface of overhang 121 (see FIGS. 1D–F). In FIG. 1G, dark arrows depict the outward flow of supercritical fluid from channel outlet 125. Based on the flow parameters of the reactant-free supercritical fluid and the reactant-containing supercritical fluid used to process the front side of wafer 117 (as depicted), as well as the mixing kinetics (including diffusion) of the two fluid mediums, the desired amount of front edge exclusion can be controlled. Preferably the channel outlet is between about 25 and 250 µm wide, more preferably about 50 µm wide.

In a particularly preferred embodiment, there may be an additional channel or channels for diverting a portion of the total flow of the reactant-free supercritical fluid through the channel formed between the exclusion ring and the pedestal, in order to modify the flow and pressure. FIG. 1H shows one example of this. In this case, a plurality of holes, 127, are included in exclusion ring 103. Incoming supercritical fluid from aperture 113 passes into the channel formed between exclusion ring 103 and pedestal 101, with a portion being diverted into hole 127. Preferably the portion of the total flow of reactant-free supercritical fluid that is diverted from flow over the wafer is between about 50 and 95%, more preferably between about 70 and 90%.

Importantly, supercritical fluid flow through hole 127 exits at a location far enough from the wafer so that it has no impact on the surface modification process, which occurs concurrently on the wafer. FIG. 1I shows another example of diverting a portion of the total flow. In this case, aperture 113 (enlarged, for example) serves as a manifold which feeds the channel formed between exclusion ring 103 and pedestal 101, as well as hole 127. In this case, fluid flow through hole 127 exits on a vertical side of the exclusion ring, again where it can have no impact on the concurrent wafer surface modification. All apparatus of the invention may have such mechanisms for diverting flow of the reactant-free supercritical fluid. One skilled in the art would understand that such fluid diversion mechanisms may take many forms.

As mentioned, preferably apparatus of the invention have as little moving parts as possible. Supercritical media can convey detrimental effects to precision moving parts, even if such components are not actually moved under supercritical conditions, as for example the active pins in apparatus 100. FIGS. 2A–F depict an apparatus, 200, of the invention. In this case, active pins are replaced with wafer transfer fingers for delivering a wafer to and from the pedestal, before and after processing, respectively.

Figure 2A:
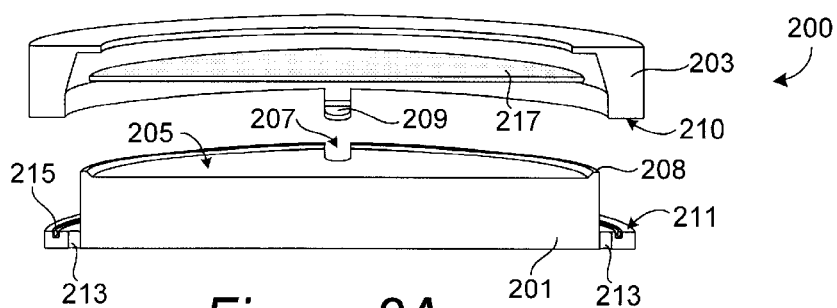
FIG. 2A is a cross sectional perspective depicting an apparatus of the invention.
Figure 2B:
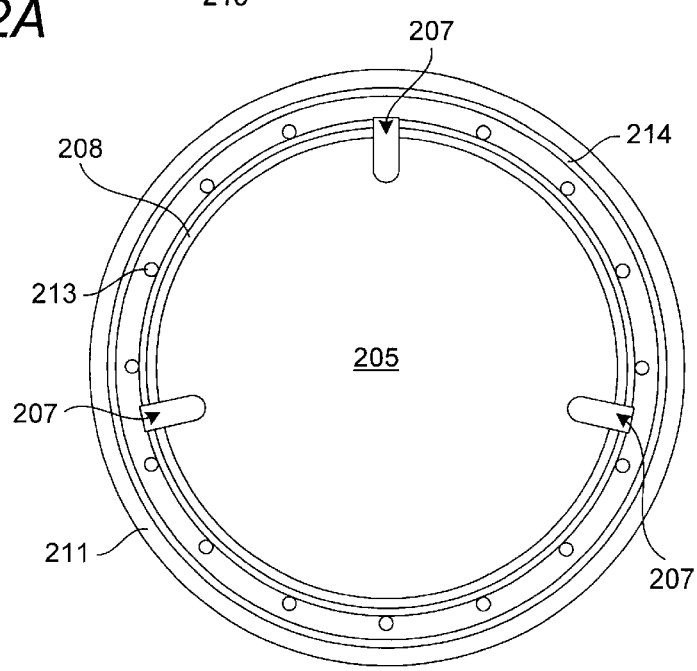
FIG. 2B depicts a top view of a pedestal of the invention.

Referring to FIG. 2A, apparatus 200 has a pedestal 201 and a non-contact exclusion ring 203. Apparatus 200 is much like apparatus 100 as described above, having a wafer support surface 205 which has a lip 208, and a flange 211 with apertures 213, and a trough 214 containing an elastomeric seal 215. FIG. 1B shows a top view of pedestal 201; wafer support surface 205 is shown in its entirety. Noticeably absent are active pins. In this case, pedestal 201 has recesses 207 (see also FIG. 2B) that are dimensioned to receive wafer transfer fingers 209 on exclusion ring 203. Prior to supercritical processing, wafer 217 is suspended on wafer transfer fingers 209 via its back side, and then the exclusion ring (holding the wafer) is lowered and engaged with pedestal 201. During engagement, wafer transfer fingers 209 travel into recesses 207, thereby transferring the wafer to the pedestal. Preferably the exclusion ring has between about 3 and 6 transfer fingers.

Non-contact exclusion ring 203 has an overhang. When non-contact exclusion ring 203 is engaged with pedestal 201 (which supports wafer 217), the overhang protrudes over an outer portion of wafer support surface 205 including lip 208. This can be seen more clearly in FIG. 2C, which depicts a top view of pedestal 201 engaged with non-contact exclusion 203. The dotted lines represent those portions of pedestal 201 that are beneath exclusion ring 203; the solid lines show the innermost and outermost edges of exclusion ring 203. In this example, some portions of recesses 207 are under exclusion ring 203 and other portions are not. Thus referring to FIG. 2C, reactant-free supercritical fluid enters pedestal 201 through apertures 213, passes through a channel formed by the engagement of pedestal 201 and exclusion ring 203. As before, the outlet of the channel is primarily defined by the surfaces of lip 208 and the overhanging portion of 203. In this case however, recesses 207 allow the reactant-free supercritical fluid to contact a portion of the wafer back side that rests over the recesses when lying on the wafer support surface. This contact can deliver lifting forces on the back side of the wafer, therefore the flow characteristics of the reactant-free supercritical fluid are controlled to minimize these lifting forces. For example, this control is mitigated by minimizing the size of recesses 207 (and thus the wafer transfer fingers), as well as positioning and dimensioning apertures 213 in a manner that diminishes lifting forces on the wafer from the impinging fluid. Another example is to strategically locate additional channels for diverting flow (as described above in relation to FIGS. 1H–I) in the exclusion ring proximate to the wafer transfer fingers (and thus recesses 207 when the exclusion ring is engaged with the pedestal). Yet another example is to vary the amount of overhang over recesses 207 and/or the distance between the overhang and recesses 207, in order to create a greater downward force on the wafer front side over the recesses than is impinging on the back side, under the recess. In this way, fluid flow and pressures can be controlled accurately in these regions.

Again referring to FIG. 2C, wafer transfer fingers are positioned on exclusion ring 203 such that a wafer can be inserted horizontally between the fingers. Thus dimension 219 is larger than the diameter of the wafer, and corresponding wafer support surface 205, as depicted. Additionally, the portion of wafer transfer finger 209 that supports (i.e. actually makes contact with the back side of wafer 217), is lower than surface 210 of exclusion ring 203 (which mates with flange 211 of pedestal 201). This can be seen more clearly in FIGS. 2D–F.

Figure 2C:
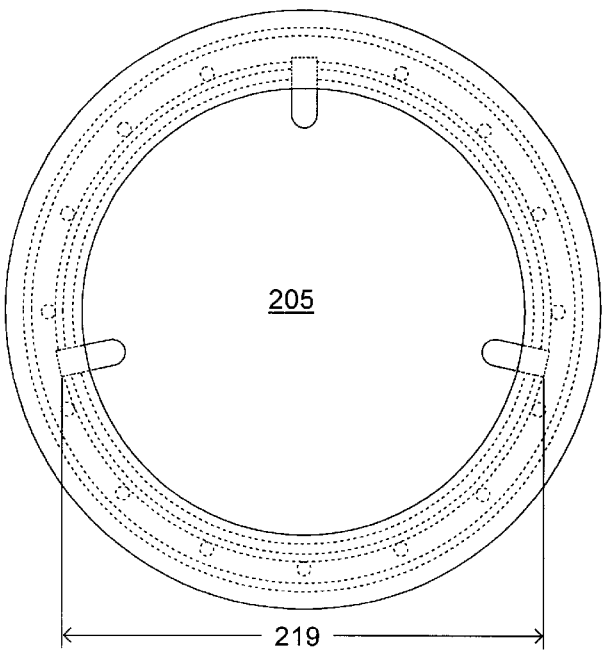
FIG. 2C depicts a top view of the pedestal in FIG. 2B engaged with the non-contact exclusion ring depicted in FIG. 2A.
Figure 2D:
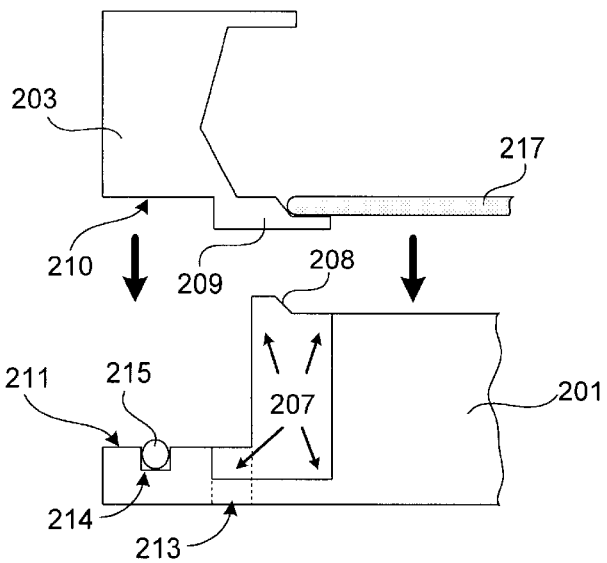
FIGS. 2D–F are cross sectional depictions showing how the pedestal and non-contact exclusion ring depicted in FIGS. 2A–C engage one another.
Figure 2E:
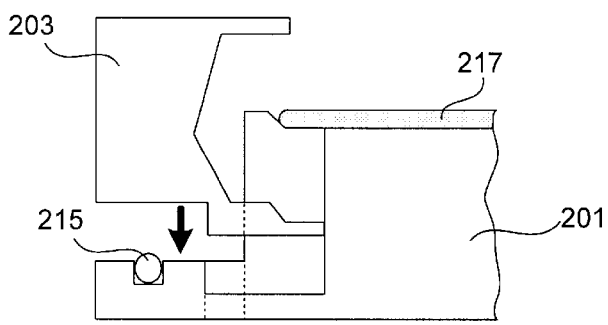
Figure 2F:
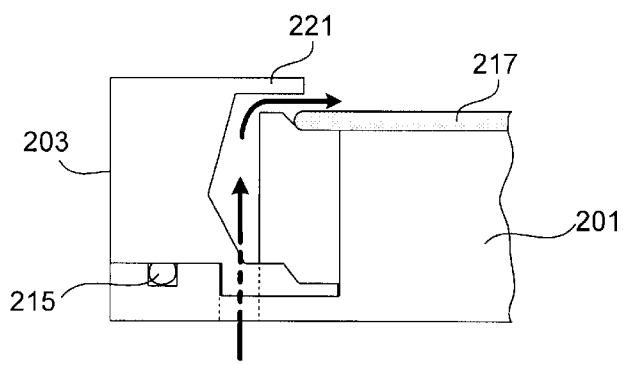

FIGS. 2D–F are cross sectional depictions of portions of pedestal 201 and non-contact exclusion ring 203 during various stages of engagement. Referring to FIG. 2D, an end effector (for example, not shown) holds wafer 217 via its back side and places the wafer (via horizontal insertion between the fingers) onto wafer transfer fingers 209. As seen in FIG. 2D, the back side of wafer 217 rests on wafer transfer finger 209. As mentioned, because the surface of finger 209 that supports the wafer is below surface 210 and the fingers are spaced as shown in FIG. 2C, the wafer can be inserted between the fingers. Alternative embodiments that can perform this function include exclusion rings with cut-outs (partial rings) with corresponding pedestals, that when mated, complete an assembly similar to that depicted in FIG. 1G (cut-outs not depicted in FIG. 1G). In such an alternative embodiment, the exclusion ring (with a cut-out) with a wafer (held by transfer fingers) may be horizontally mated with its pedestal rather than with a vertical movement as in this example.

Referring back to FIG. 2D, recess 207 is indicated in pedestal 201 by four small arrows. Also shown are flange 211, trough 214, elastomeric seal 215, and aperture 213. As mentioned (and indicated by the heavy arrows), exclusion ring 203 and wafer 217 are lowered in order to transfer wafer 217 to the pedestal and engage the exclusion ring with the pedestal. Referring to FIG. 2E, once exclusion ring 203 is lowered enough that wafer transfer finger 209 travels below wafer support surface 205, wafer 217 is deposited on the wafer support surface and centered thereon via lip 208 as described previously.

When engaged, surface 210 of exclusion ring 203 and top most surface of flange 211 will mate. FIG. 2F shows this engagement (note, exclusion ring 203 does not physically contact wafer 217). Elastomeric seal 215 is compressed to form a fluid-tight seal, and a channel is formed through which reactant-free supercritical fluid will be passed (as indicated by the heavy arrows). Thus fluid will flow through aperture 213, between the inner surface of exclusion ring 203 and the outer surface of pedestal 201, over lip 208 and under overhang 221, as before. Note that recess 207 is dimensioned so that wafer transfer finger 209 can travel below the surface of flange 211 and allow the flange to mate with surface 210 of exclusion ring 203.

As mentioned, one advantage of apparatus 200 is the elimination of active pins and static seals, thus reducing complexity. Neither apparatus 100 nor 200 make contact with the front side of a wafer during processing, however they both use heated pedestals which are not inverted. One problem that is exacerbated when processing heated wafers in supercritical fluid media, is heat loss due to convection.

As mentioned, another embodiment of the invention is an apparatus that has an inverted pedestal and a contact-exclusion ring that holds the wafer onto the inverted pedestal during supercritical processing on the wafer front side. In this way, heat loss due to natural convection is minimized. Put another way, the superior heat transfer properties of supercritical fluids are used to increase the efficiency of wafer processing. By using an inverted pedestal, naturally occurring convective forces in the supercritical medium bring heat to the wafer, rather than taking it away from the wafer.

Inverted pedestals of the invention also exploit convection phenomenon in another way. Specifically, if the reactant-free supercritical fluid used to protect the circumferential front edge of the wafer is cooled, then convection likewise can be used to facilitate flow of reactant-free supercritical fluid downward and away from the wafer surface after impinging on the circumferential front edge. This downward flow minimizes the impact that the flow of reactant-free fluid with have on the flow pattern of reactant-containing supercritical fluid that is contacting the wafer front side during processing. Additionally, if the reactant-free fluid has a higher density than the reactant-containing fluid, then intermixing of the fluids (via diffusion for example) is also minimized. Apparatus of the invention having inverted pedestals are described below in relation to FIGS. 3A–D.

Figure 3A:
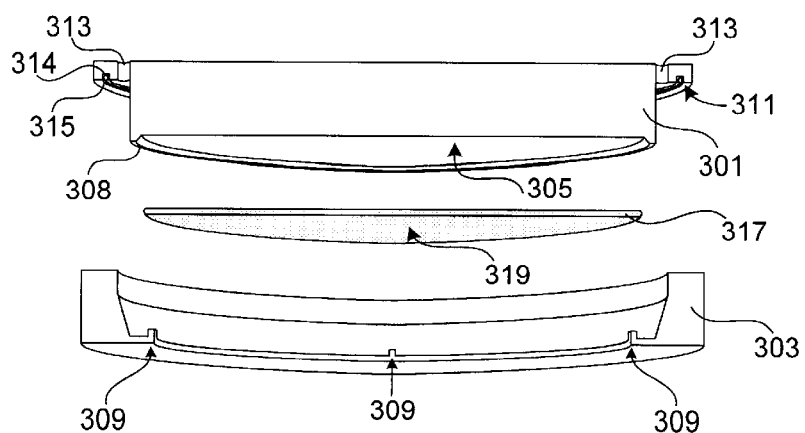
FIG. 3A is a cross sectional perspective depicting an apparatus of the invention.

FIG. 3A is a cross sectional exploded perspective depicting an apparatus, 300, of the invention. Included are an inverted pedestal 301 and a contact exclusion ring 303. Inverted pedestal 301 has a wafer support surface 305. Wafer 317 is shown suspended above exclusion ring 303 in order to depict its relative positioning with inverted pedestal 301 and contact exclusion ring 303. Wafer 317 has a front side 319 and a back side (not shown). Exclusion ring 303 has a plurality of point contacts 309, that support wafer 317 via its front side 319. When engaged with inverted pedestal 301, contact exclusion ring 303 holds the wafer (by providing a force that opposes gravity) against wafer support surface 305 via the point contacts. Preferably, as their name implies, point contacts 309 make minimal physical contact with the front side of the wafer. In this example, point contacts 309 protrude upwardly from the overhang of the exclusion ring. One skilled in the art would recognize that other arrangements of point contacts 309 can be made which oppose gravitational force on the wafer and may not touch the front side of the wafer (for example by clamping onto the edge bevel). Alternatively, a non-contact exclusion ring may be used with an inverted pedestal. In this case the inverted pedestal holds the wafer to the wafer support surface (for example via attachment via the wafer backside through electrostatic, vacuum, adhesive, or other attractive forces). In the case of a vacuum, a pressure differential of between about 2 and 20 psi (lower back side pressure than front side pressure) is needed to hold the wafer onto the pedestal during supercritical processing.

Preferably exclusion rings of the invention have between about 3 and 9 point contacts. Also preferably, the point contacts make contact with the wafer in the cicumferential front edge, that is, the area that does not come in contact with reactants during processing in apparatus of the invention. The surface area of each point contact that actually touches the wafer surface is preferably between about 0.7 and 7 $mm^2$. For example, this corresponds to a circular point contact area of between about 1 and 3 mm in diameter. These surfaces are preferably covered with a compressible material to minimize fracturing forces on the wafer during processing and handling, these materials preferably include elastomeric materials as described above. Also, the point contacts may themselves be made of a corrosion resistant material. Preferably such materials include at least one of ruby, quartz, sapphire, ceramic, and the like. In conjunction with the materials listed above, the point contacts may include springs, flexible cantilevers, or other reactive-force mechanisms to provide a force opposing gravity to the front of the wafer.

As in previously described embodiments, inverted pedestal 301 also has a flange 311 having a plurality of apertures 313 (for reactant-free supercritical fluid flow), and an elastomeric seal 315 contained in a trough 314. Analogously, when exclusion ring 303 is engaged with inverted pedestal 301, surface 310 mates with flange 311 and compresses elastomeric seal 315 to form a fluid tight seal therebetween.

In order to process the front side 319 of wafer 317, the wafer is first inserted into exclusion ring 303, front side 319 resting on point contacts 309. When exclusion ring 303 is engaged with inverted pedestal 301, wafer 317 is clamped against wafer support surface 305. By using point contacts, 309, active pins and wafer transfer fingers are avoided. This obviates any recesses in inverted pedestal 301, thus simplifying pedestal design.

Figures 3B, 3C:
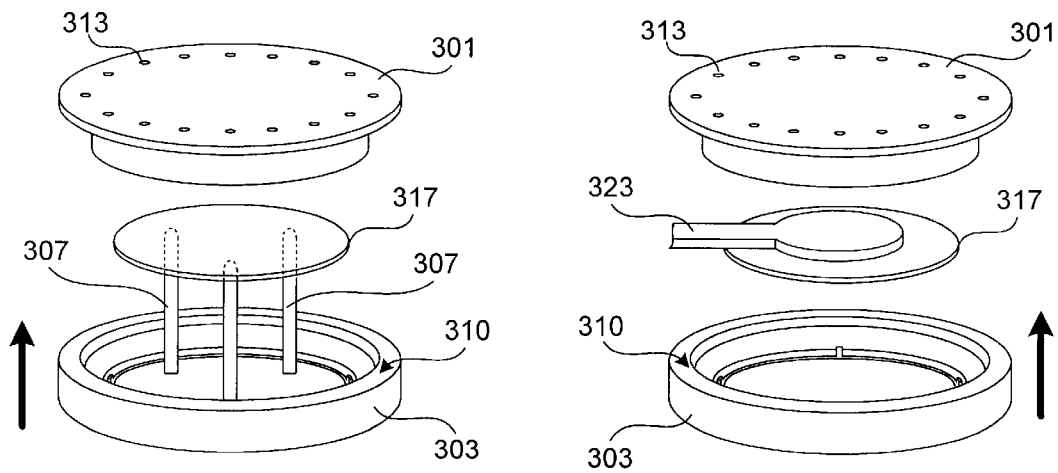
FIGS. 3B–C are perspectives of the inverted pedestal and contact exclusion ring depicted in FIG. 3A showing how a wafer is introduced into the contact exclusion ring.

FIG. 3B shows one way that wafer 317 is inserted into exclusion ring 303. First, wafer 317 is rested upon protruding static pins 307 via front side 319. Static pins 307 may be integral to the floor of a supercritical reactor, while inverted pedestal 301 is attached to the ceiling of the same reactor (reactor not shown). One skilled in the art would understand that such a reactor would include plumbing and wiring components for inverted pedestal 301. An end effector (capable of 180 rotation of the wafer to and from an inverted horizontal position) may place the wafer onto static pins 307 via the wafer back side. Once the wafer is resting on static pins 307 (as depicted) then exclusion ring 303 is lifted vertically (carrying the wafer off of static pins 307) for engagement with inverted pedestal 301, as indicated by the heavy arrow. Alternatively, an end effector 323, as described above, can gently drop the wafer into exclusion ring 303, as depicted in FIG. 3C. Once the wafer is resting on point contacts 309, exclusion ring 303 is lifted for engagement with inverted pedestal 301. As before, lip 308 serves as a centering mechanism for wafer 317 as it is, in this case, raised to wafer support surface 305.

Figure 3D:
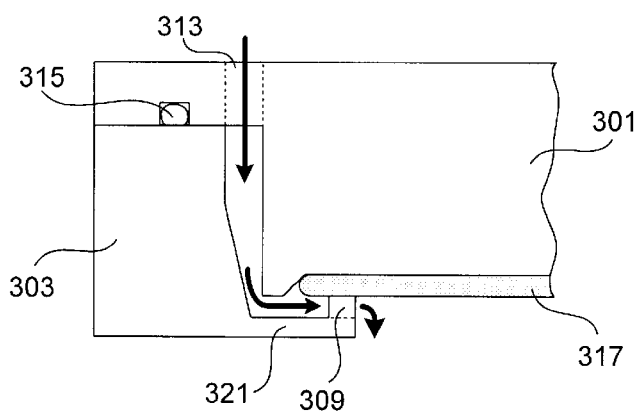
FIG. 3D is a cross sectional depiction of the inverted pedestal and contact exclusion ring depicted in FIGS. 3A–C engaged with one another.

As described previously, only after the exclusion ring is engaged with the pedestal is supercritical fluid introduced into the apparatus. When engaged, surface 310 of exclusion ring 303 and the top most surface of flange 311 will mate. FIG. 3D shows this engagement (note, exclusion ring 303 contacts wafer 317 via point contact 309). Elastomeric seal 315 is compressed to form a fluid-tight seal, and a channel is formed through which reactant-free supercritical fluid will be passed (as indicated by the heavy arrows). Fluid flows through aperture 313, between the inner surface of exclusion ring 303 and the outer surface of inverted pedestal 301, between lip 308 and overhang 321, and over the circumferential front edge. In the case of inverted pedestals, although the overhang is below the wafer, the term "overhang" is used for consistency. By using flowing a supercritical fluid through this channel that is cooler than the processing fluid, convective forces will assist in directing the flow downward and away from the wafer as the fluid exits the channel, just past the end of overhang 321 (as indicated by the heavy arrow).

As mentioned, one aspect of the invention is a method of conducting a surface modification process on the front side of a wafer in a supercritical medium containing a reactant without allowing the reactant to contact the back side and a circumferential front edge of the wafer. Methods of the invention provide an environment in which a pressure differential is established and maintained between a reactant-free supercritical fluid and a reactant-containing supercritical fluid. Such methods may be characterized by the following sequence: (a) providing the wafer to a reactor having a pedestal with a wafer support surface, the back side of the wafer contacting the wafer support surface; (b) charging the reactor with a reactant-free supercritical fluid; (c) providing a flow of the reactant-free supercritical fluid over at least the circumferential front edge of the wafer in a manner that prevents the reactant in the supercritical medium from contacting the circumferential front edge, bevel, and back side of the wafer; (d) providing the supercritical medium to the reactor; (e) performing the surface modification process; and (f) flushing the reactor with the reactant-free supercritical fluid.

Figure 4A:
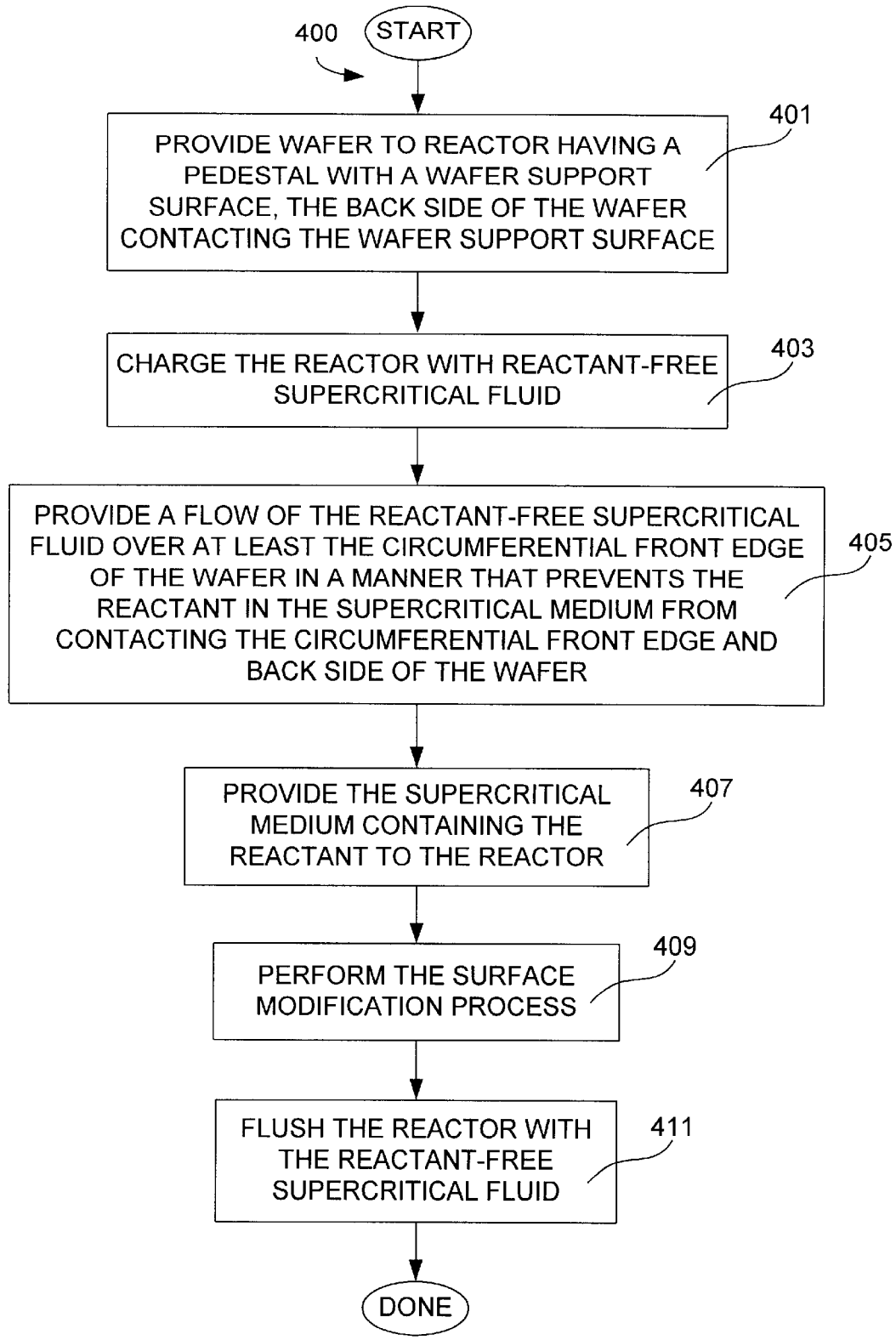
FIGS. 4A–D are flowcharts depicting aspects of process flows in accordance with the invention.

FIG. 4A presents aspects of a process flow, 400, which characterizes one such method. A wafer is provided to a supercritical reactor having a pedestal with a wafer support surface. The back side of the wafer contacts the wafer support surface. See 401. The reactor is charged with a reactant-free supercritical fluid. See 403. A flow of the reactant-free supercritical fluid is provided, over at least the circumferential front edge of the wafer, in a manner that prevents the reactant in the supercritical medium from contacting the circumferential front edge and back side of the wafer. See 405. The supercritical medium is provided to the reactor. See 407. The flow of reactant-free supercritical fluid has a greater pressure than the flow of reactant-containing supercritical medium which it encounters at the wafer work surface.

Also as mentioned, the flow pressure may take into account density gradients between the reactant-free supercritical fluid and the reactant-containing supercritical fluid. For example, a reactant-free supercritical fluid with a density greater than the supercritical medium containing the reactant may be used. Alternatively, a single supercritical fluid source is used (one source with reactant, one without); the reactant-free supercritical fluid is cooled sufficiently to give it a greater density than the reactant-containing supercritical fluid. Preferred solvents for forming supercritical fluids of the invention include but are not limited to carbon dioxide, ammonia, water, ethanol, ethane, propane, butane, pentane, dimethyl ether, hexafluoroethane, and mixtures thereof. In the simplest case, a single solvent or carrier is put under supercritical conditions to generate both the reactant-free supercritical fluid and the supercritical medium containing the reactant. One skilled in the art would understand that the reactant-free supercritical fluid may or may not contain the same solvent or carrier components as the supercritical medium containing the reactant. As well, the reactant-free supercritical fluid and the supercritical medium containing the reactant may each have more than one supercritical fluid component, for example mixtures of solvents may be used to generate each.

Referring again to FIG. 4A, the surface modification process is performed concurrently with the established pressure gradient, so that reactants in the supercritical medium do not contact the back side or the circumferential front edge of the wafer. See 409. After the surface modification is complete, the reactor is flushed with reactant-free supercritical fluid to remove any reactants from the reactor. See 411. Preferably flushing the reactor is done by at least continuing the flow of reactant-free supercritical fluid that protects the back side and circumferential front edge. Also preferably this flushing includes flowing reactant-free supercritical fluid from an additional source, for example, the same source from which the supercritical medium containing the reactant originated. After the flushing is complete, the method is done.

Figure 4B:
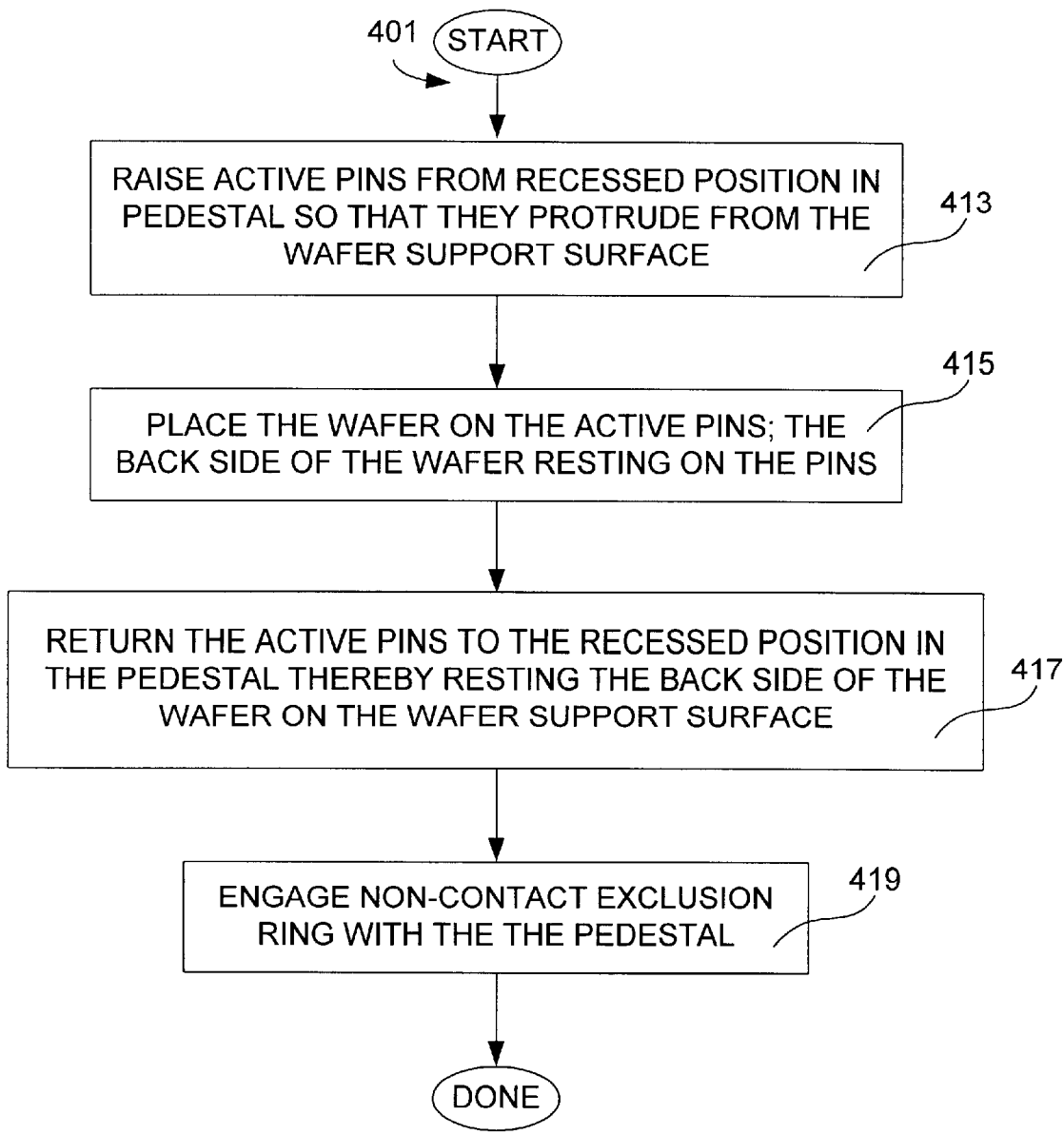

As mentioned, depending upon particular apparatus used to implement the method, providing the wafer to a reactor as described above in relation to operation 401 in FIG. 4A, will be embodied in different process flows. In accord with apparatus 100, which has active pins in the pedestal and a non-contact exclusion ring (as described in relation to FIGS. 1A–I), operation 401 may be further characterized as depicted in the process flow in FIG. 4B. The active pins are raised from a recessed position in the pedestal so that they protrude from the wafer support surface. See 413. As mentioned, the pins move in unison and protrude equally from the pedestal surface so that a wafer resting on them will be horizontal. The wafer is placed on the active pins, the back side of the wafer resting on the pins. See 415. The active pins are returned to the recessed position in the pedestal, thereby resting the back side of the wafer on the wafer support surface. See 417. Then the non-contact exclusion ring is engaged with the pedestal. See 419. After engagement, operation 401 is complete. Preferably the non-contact exclusion ring, when engaged with the pedestal, is configured to provide the flow of reactant-free supercritical fluid as described in FIG. 4A.

Figure 4C:
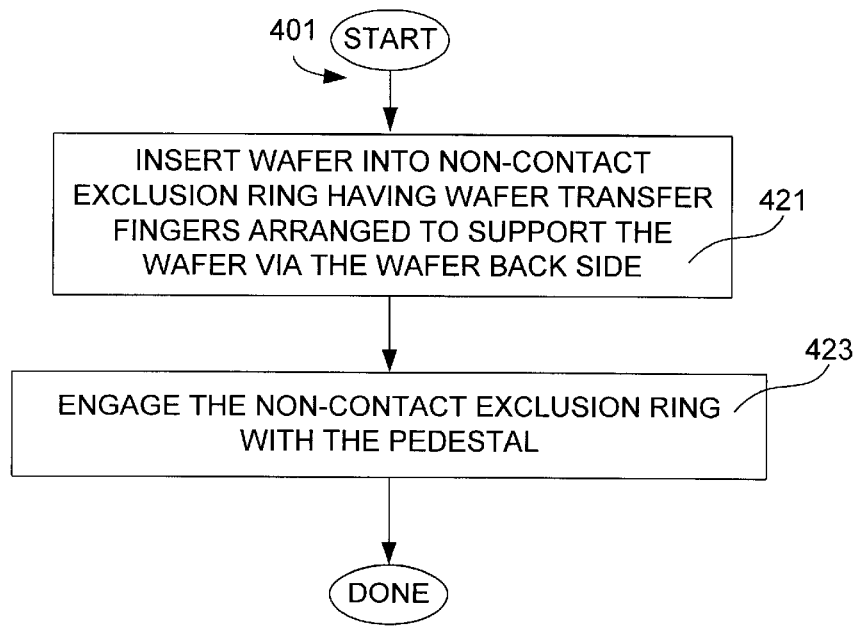

In accord with apparatus 200, which has wafer transfer fingers on the non-contact exclusion ring and corresponding recesses in the pedestal (as described in relation to FIGS. 2A–F), operation 401 of FIG. 4A may be further characterized as depicted in the process flow in FIG. 4C. The wafer is inserted into a non-contact exclusion ring having wafer transfer fingers arranged to support the wafer via the wafer backside. See 421. Then the non-contact exclusion ring is engaged with the pedestal. See 423. As described, during engagement, the wafer transfer fingers travel into the recesses in the pedestal and transfer the wafer to the wafer support surface of the pedestal. After engagement, operation 401 is complete. Preferably the non-contact exclusion ring, when engaged with the pedestal, is configured to provide the flow of reactant-free supercritical fluid as described in FIG. 4A.

Figure 4D:
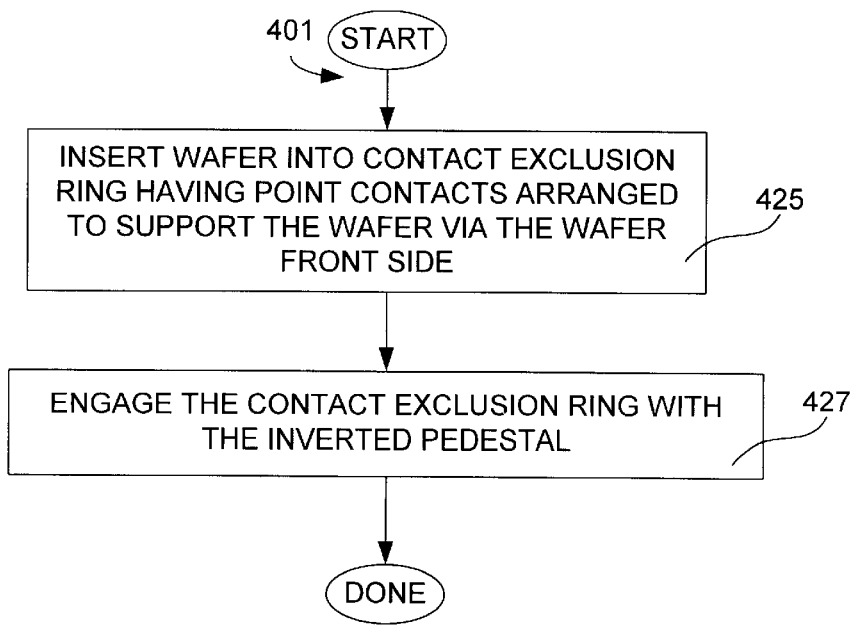

In accord with apparatus 300, which has point contacts arranged to support the wafer via the wafer front side on a contact exclusion ring and an inverted pedestal (as described in relation to FIGS. 3A–D), operation 401 of FIG. 4A may be further characterized as depicted in the process flow in FIG. 4D. The wafer is inserted into the contact exclusion ring. See 425. The contact exclusion ring is then engaged with the inverted pedestal. See 427. As described, the point contacts hold the wafer against the wafer support surface of the inverted pedestal via the wafer front side. After engagement, operation 401 is complete. Preferably the contact exclusion ring, when engaged with the inverted pedestal, is configured to provide the flow of reactant-free supercritical fluid as described in FIG. 4A.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An apparatus for immobilizing a wafer and preventing a reactant from contacting the back side, bevel, and a circumferential front edge of the wafer during a surface modification process on the front side of the wafer in a supercritical medium containing the reactant, the apparatus comprising:

(a) a pedestal having a wafer support surface, said wafer support surface configured to support the wafer via the wafer back side; and (b) an exclusion ring which when engaged with the pedestal, is configured to provide a flow of a reactant-free supercritical fluid and prevent the reactant in the supercritical medium from contacting the back side, bevel, and the circumferential front edge of the wafer during the surface modification process;

wherein the apparatus is part of a supercritical reactor assembly.

2. The apparatus of claim 1, wherein the circumferential front edge is between about 0.1 mm and 5 mm wide.

3. The apparatus of claim 1, wherein the circumferential front edge is between about 1 mm and 3 mm wide.

4. The apparatus of claim 1, wherein each of the reactant-free supercritical fluid and the supercritical medium comprise at least one of carbon dioxide, ammonia, water, ethanol, ethane, propane, butane, pentane, dimethyl ether, hexafluoroethane, and mixtures thereof.

5. The apparatus of claim 1, wherein the pedestal has an internal heat source.

6. The apparatus of claim 1, wherein the wafer support surface has a lip configured to center the wafer on the wafer support surface.

7. The apparatus of claim 6, wherein the lip protrudes from the wafer support surface at least to the elevation of the front side of the wafer when the wafer is on the wafer support surface.

8. The apparatus of claim 6, wherein the lip has a sloped surface configured to engage the wafer edge.

9. The apparatus of claim 1, wherein the pedestal has a flange with a mating surface configured to mate with the exclusion ring when the pedestal and the exclusion ring are engaged.

10. The apparatus of claim 9, wherein the mating surface has an elastomeric seal, configured to form a fluid-tight seal between the pedestal and the exclusion ring during engagement.

11. The apparatus of claim 9, wherein the exclusion ring and the pedestal form a channel when engaged, said channel configured to provide the flow of the reactant-free supercritical fluid to the wafer, said reactant-free supercritical fluid exiting the channel through a channel outlet.

12. The apparatus of claim 10, wherein the elastomeric seal comprises at least one of an O-ring, a cup seal, a flap seal, a T-seal, a C-seal, and a self-energized seal.

13. The apparatus of claim 12, wherein the elastomeric seal comprises at least one of Viton, Kalrez, Chemraz, silicone, perfluorinated hydrocarbons, EPDM, and PTFA.

14. The apparatus of claim 1, wherein the exlusion ring has an overhang, configured to protrude over the wafer's front edge when the exclusion ring is engaged with the pedestal.

15. The apparatus of claim 14, wherein the overhang protrudes between about 1 mm and 10 mm over the wafer's front edge.

16. The apparatus of claim 14, wherein the overhang protrudes between about 1 mm and 5 mm over the wafer's front edge.

17. The apparatus of claim 11, wherein the flow of reactant-free supercritical fluid exiting the channel outlet is between about 0.5 and 50 cc per minute.

18. The apparatus of claim 11, wherein the flow of reactant-free supercritical fluid exiting the channel outlet is between about 5 and 20 cc per minute.

19. The apparatus of claim 11, wherein the channel outlet is between about 25 and 250 $\mu$m wide.

20. The apparatus of claim 11, wherein the channel outlet is about 50 $\mu$m wide.

21. The apparatus of claim 11, wherein the exclusion ring is configured to divert a portion of the flow of reactant-free supercritical fluid to a location other than the wafer surface.

22. The apparatus of claim 21, wherein the portion diverted is between about 50 and 95% of the total flow of reactant-free supercritical fluid.

23. The apparatus of claim 21, wherein the portion diverted is between about 70 and 90% of the total flow of reactant-free supercritical fluid.

24. The apparatus of claim 11, wherein the flange has a plurality of apertures configured to supply the flow of the reactant-free supercritical fluid.

25. The apparatus of claim 1, wherein:

the pedestal comprises a plurality of active pins arranged to receive the wafer via the wafer back side and recess into the wafer support surface of the pedestal in order to deliver the wafer to the wafer support surface; and the exclusion ring is a non-contact exclusion ring.

26. The apparatus of claim 25, wherein the wafer support surface has a plurality of recesses, configured to receive the plurality of active pins.

27. The apparatus of claim 26, wherein each of the plurality of recesses comprise a static seal configured to prevent the reactant-free supercritical fluid from escaping between the plurality of active pins and the plurality of recesses.

28. The apparatus of claim 27, wherein the static seal comprises at least one of an O-ring, a cup seal, a flap seal, a T-seal, a C-seal, and a self-energized seal.

29. The apparatus of claim 28, wherein the static seal comprises at least one of Viton, Kalrez, Chemraz, silicone, perfluorinated hydrocarbons, EPDM, and PTFA.

30. The apparatus of claim 1, wherein the exclusion ring is a non-contact exclusion ring comprising a plurality of wafer transfer fingers arranged to support the wafer via the wafer backside for delivery of the wafer to the wafer support surface.

31. The apparatus of claim 30, wherein the wafer support surface has a plurality of recesses, configured to receive the plurality of wafer transfer fingers.

32. The apparatus of claim 30, wherein the plurality of wafer transfer fingers comprises between about 3 and 6 wafer transfer fingers.

33. The apparatus of claim 1, wherein:

the pedestal is an inverted pedestal; and the exclusion ring is a contact exclusion ring having a plurality of point contacts arranged to support the wafer via the wafer front side for delivery of the wafer to the wafer support surface, said contact exclusion ring, when engaged with the inverted pedestal, is configured to hold the wafer onto the wafer support surface of the inverted pedestal via the plurality of point contacts, the plurality of point contacts configured to exert a force opposing gravity on the front side of the wafer.

34. The apparatus of claim 33, wherein the plurality of point contacts comprises between about 3 and 9 point contacts.

35. The apparatus of claim 34, wherein the surface area of each of the plurality of point contacts that makes contact with the wafer is between about 0.7 and 7 mm$^2$.

36. The apparatus of claim 33, wherein the plurality of point contacts comprise a corrosion resistant material.

37. The apparatus of claim 36, wherein the corrosion resistant material comprises at least one of ruby, quartz, sapphire, and a ceramic.

38. The apparatus of claim 33, wherein each of the plurality of point contacts comprises a reactive-force mechanism.

39. The apparatus of claim 38, wherein the reactive-force mechanism comprises at least one of a spring, and a cantilever.

* * * * *